(12) United States Patent
Pan et al.

(10) Patent No.: US 6,447,315 B1
(45) Date of Patent: Sep. 10, 2002

(54) CONNECTING STRUCTURE FOR ELECTRONIC SIGNAL TRANSMISSION

(75) Inventors: Hao Pan, Nanjing (CN); Chengshing Lai, Taipei (TW)

(73) Assignee: Inventec Electronics (Najing) Co., Ltd., Nanjina (CN)

( * ) Notice: Subject to any disclaimer, the term of this patent is extended or adjusted under 35 U.S.C. 154(b) by 0 days.

(21) Appl. No.: 09/952,316

(22) Filed: Sep. 10, 2001

(30) Foreign Application Priority Data

Sep. 12, 2000 (CN) ........................................ 00249204 U

(51) Int. Cl.[7] ................................................ H01R 3/00
(52) U.S. Cl. ........................................ 439/165; 439/446
(58) Field of Search .................................. 439/165, 191, 439/638, 219, 194, 446, 31, 906, 492, 499, 67; 174/15.2, 16.2, 92, 50.51, 93

(56) References Cited

U.S. PATENT DOCUMENTS 5,267,880 A * 12/1993 Tamm ........................ 439/622
5,498,165 A * 3/1996 Tseng ........................... 439/31
5,499,932 A * 3/1996 Tanaka et al. ............... 439/446
6,011,699 A * 1/2000 Murray et al. ............... 361/814
6,116,966 A * 9/2000 Little et al. .................. 439/700

* cited by examiner

Primary Examiner—Tho D. Ta
Assistant Examiner—Phuongchi Nguyen
(74) Attorney, Agent, or Firm—Merchant & Gould, P.C.

(57) ABSTRACT

The present invention is related to a connecting structure for electronic signal transmission, having a hollow hinged body, with at least one pair of corresponding gaps arranged at two opposite sides of one end. Two gaps each accommodate respectively a hollow turning shaft, each with a channel on it. Two turning shafts are covered respectively by a bushing each with another channel also. A lengthy narrow FPC with plurality of lines is arranged in hollow hinged body, with mainframe and folding part arranged at two opposite sides of bushings in hinged body respectively. The end of FPC is inserted into and extends out from channel of two turning shafts and another channel of two bushings respectively, and thence enters into the mainframe and the folding part respectively to transmit signal with respect to each other.

5 Claims, 3 Drawing Sheets

CONNECTING STRUCTURE FOR ELECTRONIC SIGNAL TRANSMISSION

FIELD OF THE INVENTION

The present invention is related to a connecting structure for electronic signal transmission, particularly to a connecting structure for connection of multiple signal lines, providing mainframe and its folding part of communication product with certain functionality, and the number of signal lines can be determined according to the functional requirement of mainframe. At the same time, the turning shaft of hinged body can be folded at ease and convenient to dismantle. Moreover, color of casing may be changed in compliance with present communication product and prevalent tendency, to make it more friendly and acceptable in appearance.

BACKGROUND OF THE INVENTION

In recent years, with the significant development of communication products, and in order to meet requirements of various users, manufacturers incessantly develop various kinds of communication products, in which there are broadly two categories of connecting structure as follows:

One of them has functional structure of folding part, and adopts single hinge construction, in which 2 or 3 signal lines run through shaft of hinge to transmit signal between mainframe and folding part.

The other one has no functional structure of folding part, and adopts double hinge construction. Because of existence of two hinge shafts, the structure is rather more complicated. If said signal lines run through both shafts, not only are said lines apt to be stuck and broken, but also normal swinging of folding would also be interfered. Accordingly, most manufacturers no longer adopt the construction mode that said signal lines run through both shafts. Such structure of folding part with double hinges generally is designed only for protection or decoration purpose of product surface, without any function provided in the folding part of the product. Consequently, convenience in usage, friendliness and acceptability of said communication product are greatly deteriorated, and functionality of product cannot be enhanced.

Therefore, users will be delighted to see a product with double hinges, capable to carry out connection of multiple signal lines and to provide folding part with certain functionality. Moreover, the number of signal lines can be determined according to the functional requirement of particular product. At the same time, the turning shaft can be folded at ease and convenient to dismantle, and color of casing may be changed in compliance with present communication product and prevalent tendency, to make it more friendly and acceptable in appearance.

SUMMARY OF THE INVENTION

The aim of present invention is to provide a connecting structure for transmission of electronic signal, capable to carry out connection of multiple signal lines in double hinges.

According to the aim of present invention, a connecting structure for transmission of electronic signal is provided, in which mainframe and folding part are arranged respectively at the two bushings set up at both sides of the hollow hinged body. The end of a flexible printed circuit board installed within the hinged body is inserted into one channel and extends out from other channel respectively in the two turning shafts and bushings. Then entering into the mainframe and the folding part respectively to achieve the transmission of signals with respect to each other.

Thus, the folding part would have certain functionality, and flexible printed circuit board can bend in bushing in an orderly manner. At the same time, it can swing with the hinged body in a range of 360°, bushing and flexible printed circuit board would not be entangled, and sticking and breakage of lines also be avoided. Circuit lines would not be complicated due to the increase of the shaft number. Thus, along with the practical functionality, an effect of dexterous turning of folding part is achieved, not limiting only to such functions as the protection, rustproof, decoration etc.

Another aim of the present invention is to provide a connection structure for electronic signal transmission, in which the number of lines in a flexible printed circuit board can be varied according to requirement of function of mainframe.

Complying with said aim of the present invention, in the connecting structure provided for electronic signal transmission, multi-ply flexible printed circuit board is adopted to increase the number of circuit lines. Moreover, by means of said connecting structure, disassembling is convenient, and color of casing may be changed in compliance with present communication product and prevalent tendency, to make it more acceptable in appearance.

BRIEF DESCRIPTION OF THE DRAWINGS

In order to further recognize and understand above and other aims, features and effect of the present invention, an embodiment is elucidated in detail with the help of accompanying drawings as follows.

DETAILED DESCRIPTION OF THE PREFERRED EMBODIMENTS

Figure 1:
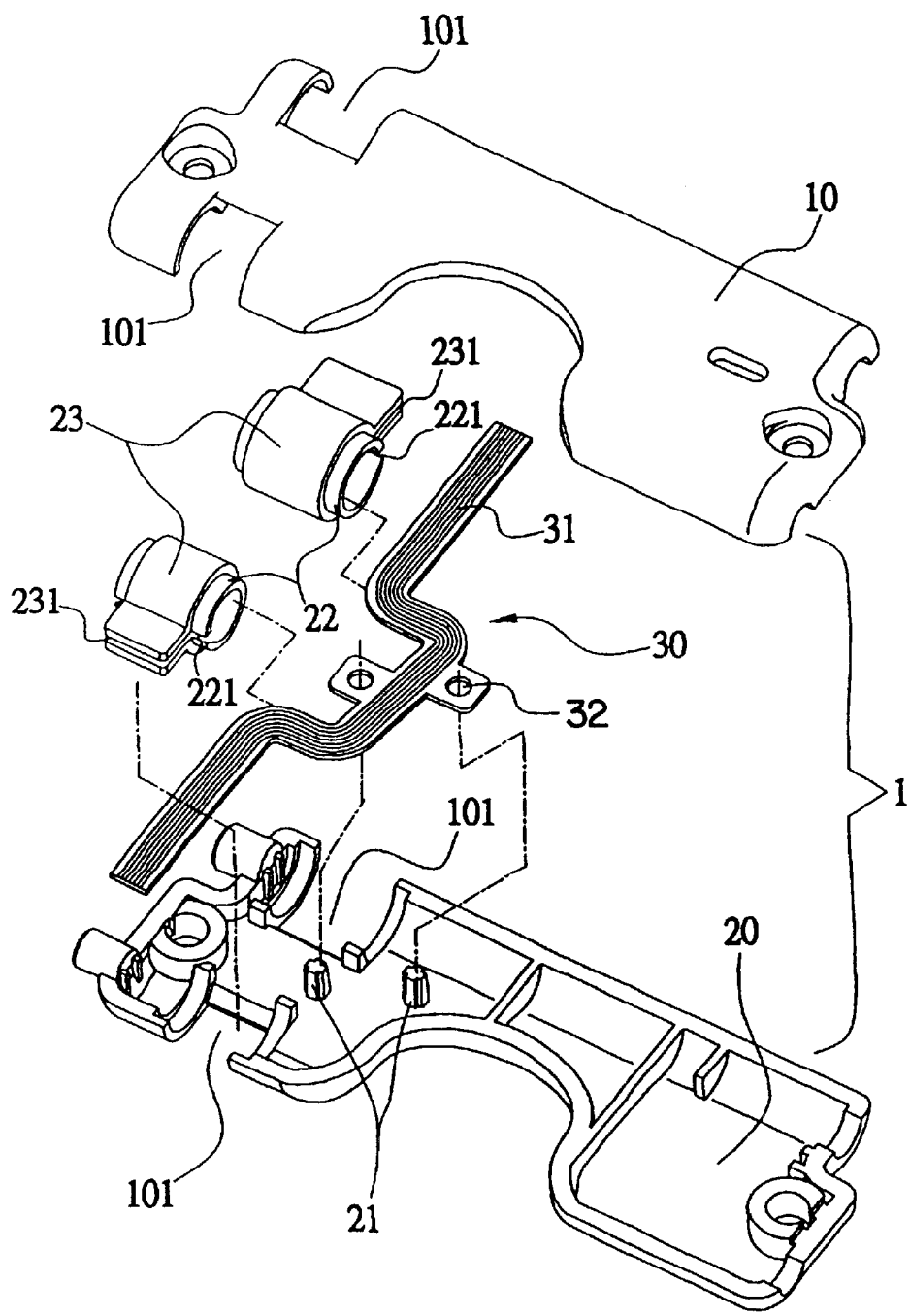
FIG. 1 is a schematic perspective exploded view of the connecting structure of the present invention.
Figure 2:
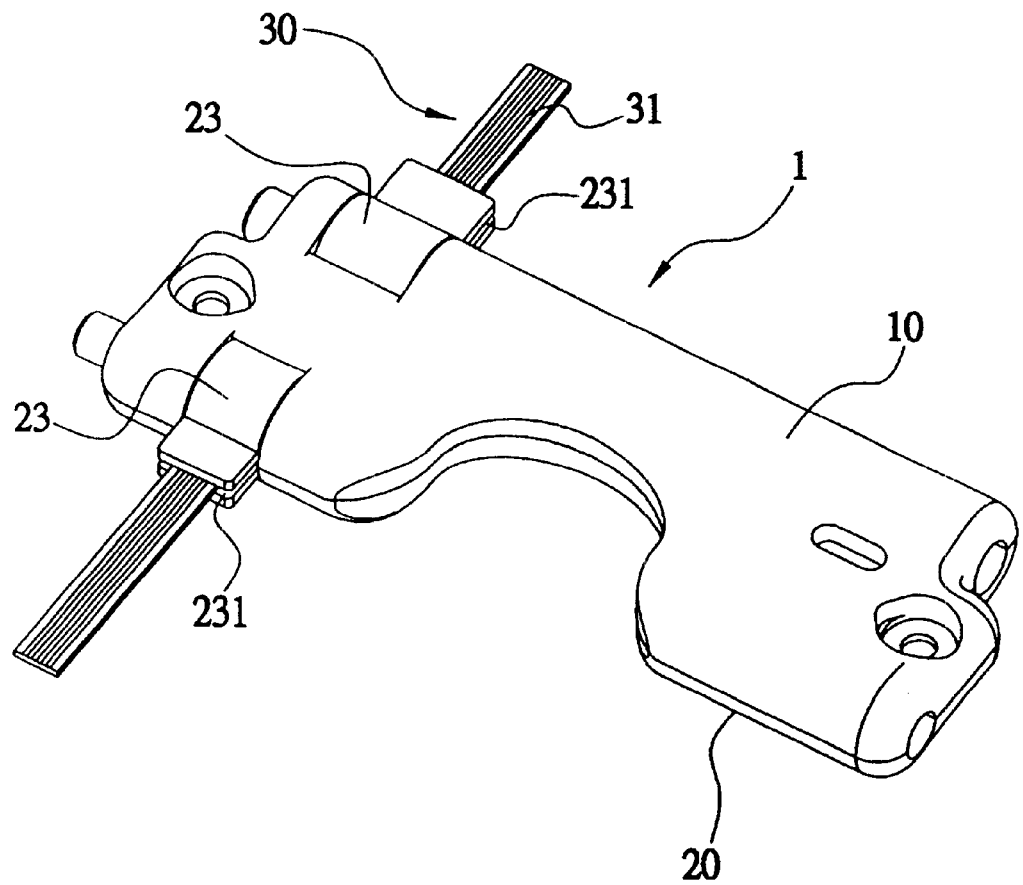
FIG. 2 is a schematic view of assembled components of the present invention.
Figure 3:
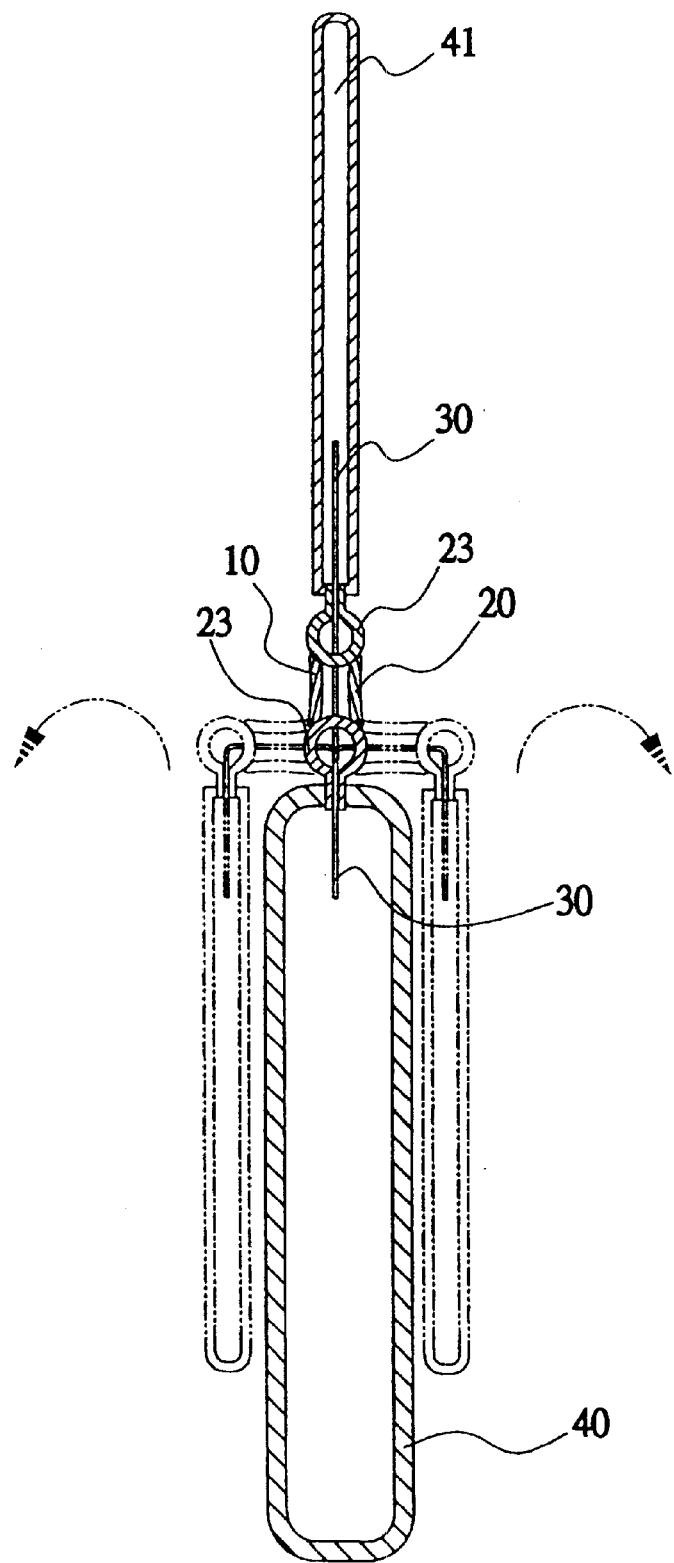
FIG. 3 is a schematic view showing the state of performance of operation of the present invention.

With reference to FIGS. 1, 2 & 3, the present invention is a connecting structure for transmission of electronic signal, with a plurality of circuit lines 31 being introduced into the mainframe 40 and the folding part 41 of communication product to transmit signal with respect to each other. Said connecting structure is a hollow hinged body, composed of an upper hinged case 10 and a lower hinged case 20. On two opposite sides of one end of said upper hinged case 10 and lower hinged case 20 are provided with at least one pair of corresponding gaps 101. In the vicinity of two gaps 101 of the lower hinged case 20 is provided at least one positioning element 21. In said embodiment, the positioning element 21 is a pillar (as shown in FIG. 1), but those persons skilled in the art should realize that other elements can also be used.

In the present embodiment, each gap 101 receives a hollow turning shafts 22 respectively. A narrow long channel 221 is set in each hollow turning shafts 22, which are covered outside by a bushing 23 respectively. The length of the bushing 23 is shorter than that of the turning shaft 22, so that two ends of turning shaft 22 are exposed at the two ends of bushing 23, and the turning shaft 22 pivoted in gap 101 could rotate freely. Moreover, bushing 23 is also provided with another narrow long channel 231 (as shown in FIG. 1), which is oriented in the same direction as the narrow long channel 221. Both said channels are arranged facing toward the outsides of hinged body respectively.

The present embodiment also comprises an excellently flexible, narrow and lengthy FPC (Flexible Printed Circuit) 30, in which are provided a plurality of signal lines 31 and at least another positioning element 32. Said positioning element 32 can just be positioned in at least a positioning element 21 of the lower hinged case 20. In the present embodiment, said another positioning element 32 is a positioning hole, but those persons skilled in the art should realize that it could be replaced by other elements.

In the present embodiment, the mainframe 40 and the folding part 41 are arranged at two opposite sides of bushings 23 in the hinged body 1 respectively (as shown in FIGS. 2, 3). The end of said FPC 30 is inserted into and extends out from the channel 221 of two turning shafts 22 and another channel 231 of the two bushings 23 respectively, and thence enters into the mainframe 40 and the folding part 41 respectively to transmit signal between each other. As a result, the folding part 41 would have certain functionality, e.g. an input key or certain functional switch (not shown in figure) may be set up on the folding part 41 respectively. And the number of lines 31 in FPC 30 could be varied according to functional requirement of mainframe 40, through adoption of a multi-ply FPC board to increase the number of lines 31.

In above structure, FPC 30 of the present invention is inserted into and extends out from channel 221 of two turning shafts 22 and another channel 231 of two bushings 23 respectively, and two bushings 23 would rotate concentrically in the two gaps 101 around the axis. As FPC 30 is sandwiched in another channel 231 of two bushings 23, FPC 30 can only bend orderly in two bushings 23 (as shown in FIG. 3). At the same time, FPC 30 can swing together with the hinged body 1, and bushing 23 and FPC 30 would not be entangled, the sticking and breakage of lines can also be avoided. In addition, circuit lines would not be complicated due to the increase of the number of the shaft 22. Thus, along with the practical functionality, an effect of 360° dexterous turning of folding part 41 is achieved, not limiting only to such functions as protection, dustproof, decoration etc. Moreover, by means of said connecting structure, disassembling is convenient, and color of casing may be changed in compliance with present communication product and prevalent tendency, to make it more acceptable in appearance.

The above illustration and explanation are just an example to elucidate the embodiment of the present invention. Those persons skilled in the art may realize that various equivalent modifications of details can be made in the embodiment, all these modifications are intended to be included in the spirit and protection scope of the present invention.

What is claimed is:

1. A connecting structure for electronic signal transmission, comprising:

a hollow hinged body on two opposite sides of one end thereof, at least one pair of corresponding gaps are provided, and near said two gaps in said hinged body is set up at least one positioning element;

hollow turning shafts, arranged respectively in said two gaps, and each said hollow shaft has a lengthy narrow channel;

bushings, provided respectively on the outer surface of the hollow turning shafts and said bushings each have another narrow and long channel, oriented in the same direction as the narrow and long channel of the hollow turning shaft and facing respectively toward the outside of the hinged body;

a flexible printed circuit board, provided with a plurality of signal lines and at least one additional positioning element said flexible printed circuit board is inserted into and extends out from said channels, and said additional positioning element can be just located at least in a positioning element of said hinged body.

2. A connecting structure for electronic signal transmission as defined in claim 1, wherein said hinged body is composed of an upper hinge case and a lower hinge case.

3. A connecting structure for electronic signal transmission as defined in claim 1, wherein said positioning element is a pillar.

4. A connecting structure for electronic signal transmission as defined in claim 1, wherein the length of said bushing is shorter than that of the turning shaft, so that two ends of said turning shaft are exposed at the two ends of said bushing.

5. A connecting structure for electronic signal transmission as defined in claim 1, wherein said another positioning element is a positioning hole.

* * * * *

UNITED STATES PATENT AND TRADEMARK OFFICE
CERTIFICATE OF CORRECTION

PATENT NO.     : 6,447,315 B1
DATED          : September 10, 2002
INVENTOR(S)    : Pan et al.

It is certified that error appears in the above-identified patent and that said Letters Patent is hereby corrected as shown below:

<u>Title page,</u>
Item [73], Assignee, "Nanjina" should read -- Nanjing --

Signed and Sealed this

Fifteenth Day of April, 2003

JAMES E. ROGAN
*Director of the United States Patent and Trademark Office*